US009633621B2

(12) United States Patent
Kim et al.

(10) Patent No.: US 9,633,621 B2
(45) Date of Patent: Apr. 25, 2017

(54) SOURCE DRIVING CIRCUIT CAPABLE OF COMPENSATING FOR AMPLIFIER OFFSET, AND DISPLAY DEVICE INCLUDING THE SAME

(71) Applicant: Samsung Electronics Co., Ltd., Suwon-si (KR)

(72) Inventors: Hyung-Tae Kim, Hwaseong-si (KR); Vic Lee, Longtan Township (TW); Julius Pan, Taipei (TW); Yuwen Chiou, Hsinchu (TW)

(73) Assignee: Samsung Electronics Co., Ltd. (KR)

(*) Notice: Subject to any disclaimer, the term of this patent is extended or adjusted under 35 U.S.C. 154(b) by 91 days.

(21) Appl. No.: 14/478,078

(22) Filed: Sep. 5, 2014

(65) Prior Publication Data

US 2015/0194086 A1 Jul. 9, 2015

(30) Foreign Application Priority Data

Jan. 7, 2014 (KR) ........................ 10-2014-0002059

(51) Int. Cl.
*G09G 3/36* (2006.01)
*G09G 3/20* (2006.01)
*H03F 3/30* (2006.01)

(52) U.S. Cl.
CPC ..... *G09G 3/3688* (2013.01); *G09G 2310/027* (2013.01); *G09G 2310/0291* (2013.01)

(58) Field of Classification Search
CPC ......... G09G 2310/0291; G09G 3/3648; G09G 3/3677
See application file for complete search history.

(56) References Cited

U.S. PATENT DOCUMENTS 5,734,366 A * 3/1998 Kubota ................ G09G 3/2011 345/100
6,441,562 B1 * 8/2002 Kim ......................... G09G 3/20 315/169.1
6,954,491 B1 * 10/2005 Kim ........................ H04L 25/45 348/E7.026
7,336,124 B2 2/2008 Kasai et al.
8,068,080 B2 11/2011 Nishimura
8,279,148 B2 10/2012 Choi et al.
2002/0158859 A1 * 10/2002 Nakano .................... G09G 3/20 345/204
2008/0143665 A1 * 6/2008 Nishimura ........... G09G 3/3677 345/96
2008/0150865 A1 * 6/2008 Choi .................... G09G 3/3688 345/89
2008/0191804 A1 * 8/2008 An ........................ H03F 3/3023 330/255
2009/0007029 A1 * 1/2009 So ....................... G06F 17/5022 716/132

(Continued)

*Primary Examiner* — Lin Li
(74) *Attorney, Agent, or Firm* — Onello & Mello LLP

(57) ABSTRACT

A display device capable of decreasing an amplifier offset using a gate-start pulse signal is disclosed. A display device includes a display panel, a control circuit, a gate driving circuit and a source driving circuit. The source driving circuit includes a plurality of source driving chips, compensates for an amplifier offset in response to the gate-start pulse signal, performs digital-to-analog (D/A) conversion on data received from the control circuit using gray scale voltages in response to the source control signal, and provides the converted data to the source lines.

13 Claims, 9 Drawing Sheets

(56) References Cited

U.S. PATENT DOCUMENTS

| | | | | |
|---|---|---|---|---|
| 2011/0181570 | A1* | 7/2011 | Minami | G09G 3/3688 345/209 |
| 2011/0199397 | A1* | 8/2011 | Ko | G09G 3/3688 345/690 |
| 2012/0105500 | A1* | 5/2012 | Wu | G09G 3/3688 345/690 |
| 2012/0256970 | A1* | 10/2012 | Kim | G09G 3/2003 345/690 |
| 2012/0299903 | A1 | 11/2012 | Lim et al. | |
| 2014/0009511 | A1* | 1/2014 | Hsiao | G09G 3/3614 345/690 |
| 2014/0145921 | A1* | 5/2014 | Imai | G09G 3/3688 345/87 |
| 2014/0198273 | A1* | 7/2014 | Wang | G09G 3/3677 349/33 |

* cited by examiner

1350

1341

SOURCE DRIVING CIRCUIT CAPABLE OF COMPENSATING FOR AMPLIFIER OFFSET, AND DISPLAY DEVICE INCLUDING THE SAME

CROSS-REFERENCE TO RELATED APPLICATION

This application claims priority under 35 U.S.C. §119 to Korean Patent Application No. 10-2014-0002059 filed on Jan. 7, 2014, the disclosure of which is hereby incorporated by reference in its entirety.

BACKGROUND

Field

Exemplary embodiments in accordance with principles of inventive concepts relate to a display device, and more particularly, to a source driving circuit of a display device.

Related Art

Display devices such as a liquid crystal display (LCD) device include a source driving circuit and a gate driving circuit that drive a panel, or, more particularly, drive pixel transistors. The source driving circuit outputs data and includes an output buffer circuit including amplifiers.

The output deviation of a source driving circuit could produce unwanted effects in a display device and, in particular, in a high resolution display device and reduction of such deviation may be advantageous for use in such display devices.

SUMMARY

Exemplary embodiments in accordance with principles of inventive concepts include a display device, that includes a display panel including a plurality of gate lines and a plurality of source lines disposed perpendicularly to the plurality of gate lines; a control circuit configured to generate a source control signal, to generate a gate control signal and a gate-start pulse signal, to process data according to operating conditions of the display panel, and to output the processed data; a gate driving circuit including a plurality of gate driving chips, configured to generate gate signals including a combination of on-voltage and off-voltage in response to the gate-start pulse signal and the gate control signal, and to apply the gate signals to the gate lines; and a source driving circuit including a plurality of source driving chips configured to compensate for an amplifier offset in response to the gate-start pulse signal, to perform digital-to-analog conversion on data received from the control circuit using gray scale voltages in response to the source control signal, and to provide the converted data to the source lines.

Exemplary embodiments in accordance with principles of inventive concepts include a display device wherein, of the plurality of source driving chips in the source driving circuit, a first source driving chip directly receives the gate-start pulse signal from the control circuit, and the remaining source driving chips receive a signal generated by the first source driving chip derived from the gate-start pulse signal.

Exemplary embodiments in accordance with principles of inventive concepts include a display device wherein the plurality of source driving chips is configured to be mounted on respective corresponding flexible printed circuit boards.

Exemplary embodiments in accordance with principles of inventive concepts include a display device wherein the gate-start pulse signal is provided to a first source driving chip through a conductive line disposed in a flexible printed circuit board on which the first source driving chip of the plurality of source driving chips is mounted.

Exemplary embodiments in accordance with principles of inventive concepts include a display device wherein the gate-start pulse signal is provided to the gate driving circuit so as to pass through the first source driving chip through a conductive line disposed in a flexible printed circuit board on which a first source driving chip is mounted of the plurality of source driving chips.

Exemplary embodiments in accordance with principles of inventive concepts include a display device wherein the source driving circuit comprises: an input circuit of a first source driving chip configured to combine the gate-start pulse signal and an input/output control signal included in the source control signal to generate a first signal; a demodulator of the first source driving chip configured to perform demodulation on the first signal to generate a first internal gate-start pulse signal and a first internal input/output control signal; an input circuit of a second source driving chip configured to receive the first signal from the input circuit of the first source driving chip, and output the first signal; and a demodulator of the second source driving chip configured to receive the first signal from the input circuit of the second source driving chip, and perform demodulation on the first signal to generate a second internal gate-start pulse signal and a second internal input/output control signal.

Exemplary embodiments in accordance with principles of inventive concepts include a display device wherein the first signal is configured to include information related to the gate-start pulse signal.

Exemplary embodiments in accordance with principles of inventive concepts include a display device wherein the input circuit of the first source driving chip comprises: a delay circuit configured to delay the gate start pulse signal for a certain time; an XNOR gate configured to perform exclusive NOR operation on an output signal of the delay circuit and the gate-start pulse signal; and a multiplexer configured to select either an output signal of the XNOR gate or the input/output control signal to generate the first signal.

Exemplary embodiments in accordance with principles of inventive concepts include a display device wherein the delay circuit includes an even number of inverters connected in series.

Exemplary embodiments in accordance with principles of inventive concepts include a display device wherein the source driving circuit comprises: an input circuit of a first source driving chip configured to combine the gate-start pulse signal and an input/output control signal included in the source control signal to generate a first signal; a demodulator of the first source driving chip configured to perform demodulation on the first signal to generate a first internal gate-start pulse signal and a first internal input/output control signal; an input circuit of a second source driving chip configured to receive the first signal from the input circuit of the first source driving chip, and output the first signal; a demodulator of the second source driving chip configured to receive the first signal from the input circuit of the second source driving chip, and perform demodulation on the first signal to generate a second internal gate-start pulse signal and a second internal input/output control signal; an input circuit of a third source driving chip configured to receive the first signal from the input circuit of the second source driving chip, and output the first signal; a demodulator of the third source driving chip configured to receive the first signal from the input circuit of the third source driving chip, and perform demodulation on the first signal to generate a third internal gate-start pulse signal and a third internal input/output control signal; an input circuit of a fourth source driving chip configured to receive the first signal from the input circuit of the third source driving chip, and output the first signal; and a demodulator of the fourth source driving chip configured to receive the first signal from the input circuit of the fourth source driving chip, and perform demodulation on the first signal to generate a fourth internal gate-start pulse signal and a fourth internal input/output control signal.

Exemplary embodiments in accordance with principles of inventive concepts include a display device wherein the source driving circuit comprises: a first source driving chip configured to receive the gate-start pulse signal from the control circuit, and generate a first signal having information of the gate-start pulse signal and a first internal gate-start pulse signal based on the gate-start pulse signal; and a second source driving chip configured to receive the first signal having information of the gate-start pulse signal from the first source driving chip, and generate a second internal gate-start pulse signal based on the first signal.

Exemplary embodiments in accordance with principles of inventive concepts include a display device wherein the source driving circuit comprises: an input buffer circuit configured to receive the gate-start pulse signal and an input/output control signal, and generate a first signal corresponding to the gate-start pulse signal and a second signal corresponding to the input/output control signal based on the gate-start pulse signal and the input/output control signal; a shift register configured to generate a pulse signal based on a clock signal and the second signal; a data latch circuit configured to latch data according to a shift order of the shift register, and output the data as digital input signals in response to a load signal; a digital-to-analog converter configured to generate input voltage signals corresponding to the digital input signals using gray voltages; and an output buffer circuit including a plurality of channel amplifiers, and configured to compensate for an amplifier offset of each of the channel amplifiers in response to the first signal, and buffer the input voltage signals to generate source signals.

Exemplary embodiments in accordance with principles of inventive concepts include a display device wherein the input buffer circuit comprises: an input circuit configured to combine the gate-start pulse signal and the input/output control signal included in the source control signal to generate a first signal; and a demodulator configured to perform demodulation on the first signal to generate an internal gate-start pulse signal and an internal input/output control signal.

Exemplary embodiments in accordance with principles of inventive concepts include a display device wherein the output buffer circuit is configured to react to an output voltage signal of each of the channel amplifiers in a state in which a non-inverted input terminal and an inverted input terminal of a differential input unit of each of the channel amplifiers are electrically connected, by compensating for amplifier offset.

Exemplary embodiments in accordance with principles of inventive concepts include a source driving circuit of a display device including an input buffer circuit configured to receive a gate-start pulse signal and an input/output control signal, and generate a first signal corresponding to the gate-start pulse signal and a second signal corresponding to the input/output control signal based on the gate-start pulse signal and the input/output control signal; a shift register configured to generate a pulse signal based on a clock signal and the second signal; a data latch circuit configured to latch data according to a shift order of the shift register, output the data as digital input signals in response to a load signal; a digital-to-analog converter configured to generate input voltage signals corresponding to the digital input signals using gray voltages; and an output buffer circuit including a plurality of channel amplifiers, and configured to compensate for an amplifier offset of each of the channel amplifiers in response to the first signal, and buffer the input voltage signals to generate a source signals.

Exemplary embodiments in accordance with principles of inventive concepts include a source driver circuit for a panel display including a circuit configured to supply analog signals representative of pixel data; and an output buffer circuit configured to receive the analog signals, wherein the output buffer circuit includes a differential amplifier and an offset compensation circuit configured to compensate for offsets in the differential amplifier.

Exemplary embodiments in accordance with principles of inventive concepts include a source driver circuit wherein the offset compensation circuit includes a current-steering circuit configured to counteract an offset of the differential amplifier.

Exemplary embodiments in accordance with principles of inventive concepts include a source driver circuit wherein the offset compensation circuit responds to a transition in the output of the differential amplifier when inverting and non-inverting inputs of the differential amplifier are electrically connected by adjusting a compensating current flow.

Exemplary embodiments in accordance with principles of inventive concepts include a panel display driver including a gate driving circuit and a source driver circuit for a panel display including a circuit configured to supply analog signals representative of pixel data; and an output buffer circuit configured to receive the analog signals, wherein the output buffer circuit includes a differential amplifier and an offset compensation circuit configured to compensate for offsets in the differential amplifier.

Exemplary embodiments in accordance with principles of inventive concepts include a display that includes a panel with thin film transistors arrayed in pixel locations and a panel display driver including a gate driving circuit and a source driver circuit for a panel display including a circuit configured to supply analog signals representative of pixel data; and an output buffer circuit configured to receive the analog signals, wherein the output buffer circuit includes a differential amplifier and an offset compensation circuit configured to compensate for offsets in the differential amplifier.

BRIEF DESCRIPTION OF THE DRAWINGS

The foregoing and other features and advantages of the inventive concept will be apparent from the more particular description of exemplary embodiments in accordance with principles of inventive concepts, as illustrated in the accompanying drawings in which like reference characters refer to the same parts throughout the different views. The drawings are not necessarily to scale, emphasis instead being placed upon illustrating the principles of inventive concepts. In the drawings.

DETAILED DESCRIPTION OF THE EMBODIMENTS

Figure 1:
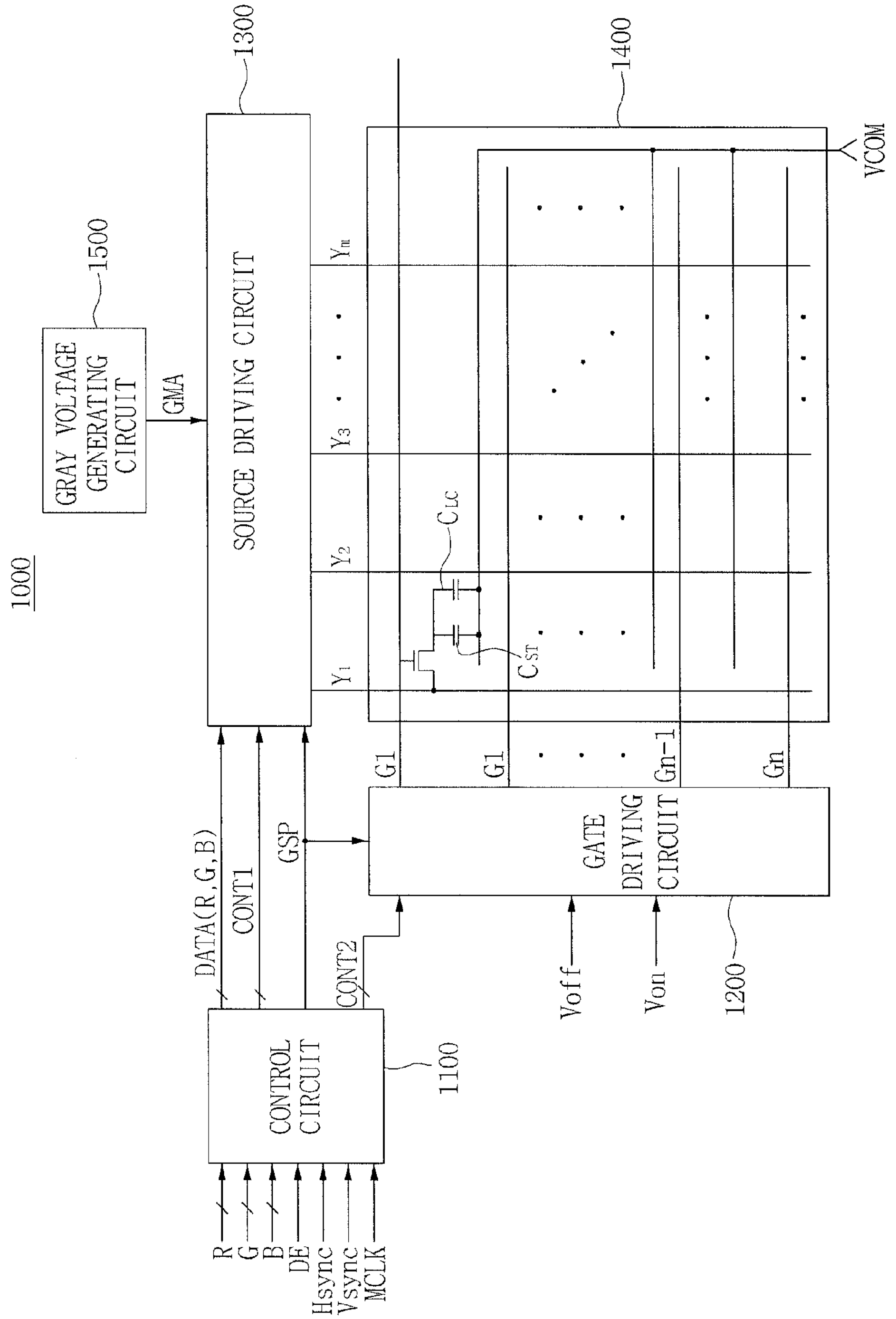
FIG. 1 is a circuit diagram illustrating an exemplary embodiment of a display device in accordance with principles of inventive concepts.

Various exemplary embodiments will be described more fully hereinafter with reference to the accompanying drawings, in which exemplary embodiments are shown. Exemplary embodiments may, however, be embodied in many different forms and should not be construed as limited to exemplary embodiments set forth herein. Rather, these exemplary embodiments are provided so that this disclosure will be thorough, and will convey the scope of exemplary embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items. The term "or" is used in an inclusive sense unless otherwise indicated.

It will be understood that, although the terms first, second, third, for example. may be used herein to describe various elements, components, regions, layers and/or sections, these elements, components, regions, layers and/or sections should not be limited by these terms. These teams are only used to distinguish one element, component, region, layer or section from another region, layer or section. In this manner, a first element, component, region, layer or section discussed below could be termed a second element, component, region, layer or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. In this manner, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to illustrations that are schematic illustrations of idealized exemplary embodiments (and intermediate structures). As such, variations from the shapes of the illustrations as a result, for example, of manufacturing techniques and/or tolerances, are to be expected. In this manner, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. In this manner, the regions illustrated in the figures are schematic in nature and their shapes are not intended to illustrate the actual shape of a region of a device and are not intended to limit the scope of exemplary embodiments.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a circuit diagram illustrating a display device 1000 that includes an exemplary embodiment of a source driving circuit in accordance with principles of inventive concepts. LCD device 1000 includes a control circuit 1100, a gate driving circuit 1200, a source driving circuit 1300, a display panel 1400, and a gray voltage generating circuit 1500.

The display panel 1400 includes thin film transistors (TFTs) located at each intersection of the matrix. Each TFT includes a source that receives a source signal (also referred to herein as a "data signal") and a gate that receives a gate signal (also referred to herein as a "scan signal"). A storage capacitor CST and a liquid crystal capacitor CLC may be connected between a drain of the TFT and a common voltage VCOM. The liquid crystal panel 1400 receives gate signals through gate lines G1 to Gn, and source signals through source lines Y1 to Ym, respectively. The gate driving circuit 1200 produces the gate signals using an on-voltage Von and an off-voltage Voff, and applies the gate signals to the gate lines G1 to Gn.

The gray voltage generating circuit 1500 generates positive and negative gray-scale voltages GMA associated with the brightness of the display device 1000.

The source driving circuit 1300 performs a digital-to-analog (D/A) conversion on data DATA received from the control circuit 1100 using the gray scale voltages GMA that are outputs of the gray voltage generating circuit 1500, and applies the converted data to the source lines D1 to Dm. The data DATA determines a gray level with respect to each pixel.

The controller 1100 receives RGB video signals R, G and B and control signals, such as a vertical sync signal Vsync, a horizontal sync signal Hsync, a main clock signal MCLK, and a data enable signal DE, for example. The control circuit 1100 generates source control signals CONT1, gate control signals CONT2 and a gate-start pulse signal GSP based on the control signals. Controller 1100 also processes the RGB video signals R, G and B so as to meet operational conditions of the display panel 1400. Control circuit 1100 transmits the gate-start pulse signal GSP and the gate control signals CONT2 to the gate driving circuit 1200, and transmits the source control signals CONT1, the gate-start pulse signal GSP and the video signals DATA (R, G, B) to the source driving circuit 1300.

In exemplary embodiments in accordance with principles of inventive concepts, gate driving circuit 1200 and the source driving circuit 1300 include a plurality of gate driving chips (not shown) and a plurality of source driving chips, respectively. The source driving circuit 1300 applies the source signals to the source lines arranged on the display panel 1400, and the gate driving circuit 1200 applies the gate signals to the gate lines arranged on the display panel 1400.

In exemplary embodiments in accordance with principles of inventive concepts, source driving circuit 1300 included in the display device 1000 of FIG. 1 may compensate for any offset that may appear in an amplifier, may perform a digital-to-analog (D/A) conversion on data DATA received from the control circuit 1100 using gray scale voltages in response to the source control signal, and may provide the converted data to the source lines. In exemplary embodiments in accordance with principles of inventive concepts, amplifier offset compensation performed by source driving circuit 1300 may be timed in relation to the gate-start pulse signal GSP, for example. Of the plurality of source driving chips of the source driving circuit 1300 in exemplary embodiments, a first source driving chip may directly receive the gate-start pulse signal GSP from the control circuit, and the remaining source driving chips may receive a signal generated by the first source driving chip related to gate-start pulse signal GSP.

In exemplary embodiments in accordance with principles of inventive concepts, the plurality of source driving chips may be mounted on respective flexible printed circuit (FPC) boards. The gate-start pulse signal GSP may be provided to a source driving chip 2410 of the plurality of source driving chips 2410, 2420, 2430 and 2440 through a conductive line disposed in a flexible printed circuit board 2415 upon which the first source driving chip 2410 is mounted, for example. The gate-start pulse signal GSP may be provided to the gate driving circuit of the plurality of source driving chips so as to pass through the first source driving chip through a conductive line disposed in a flexible printed circuit (FPC) board on which the first source driving chip is mounted, for example.

Figure 2:
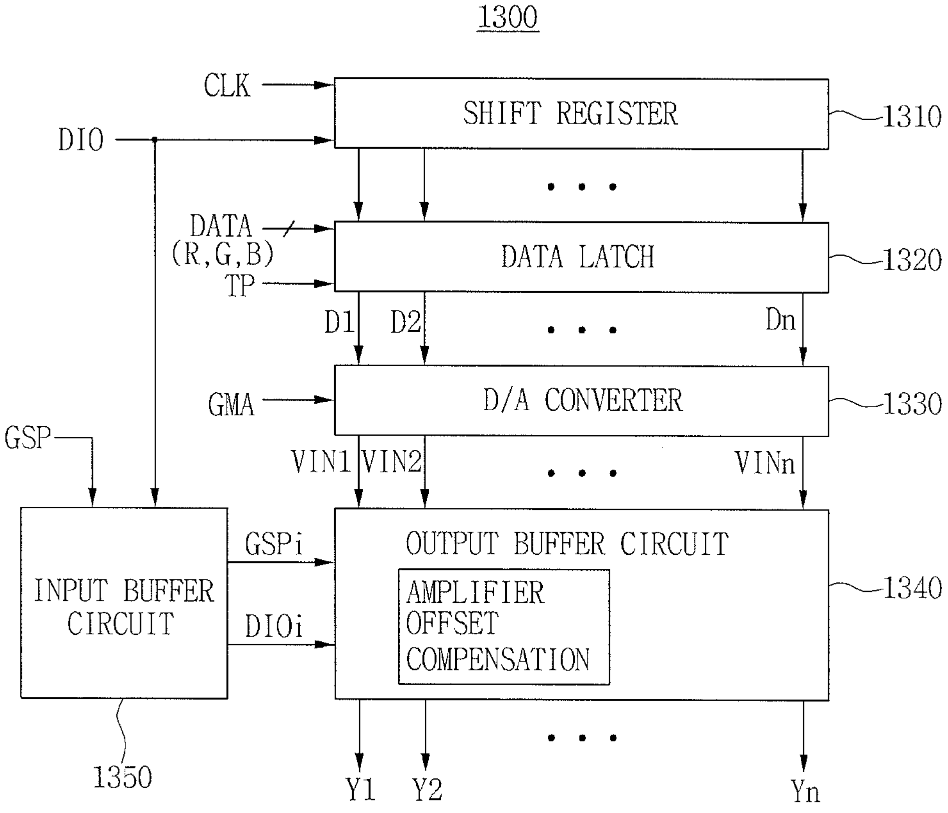
FIG. 2 is a block diagram illustrating an example of a source driving circuit included in the display device of FIG. 1.

FIG. 2 is a block diagram illustrating an exemplary embodiment of a source driving circuit 1300 in accordance with principles of inventive concepts, such as that included in the display device 1000 of FIG. 1. Source driving circuit 1300 may include a shift register 1310, a data latch circuit 1320, a digital-to-analog converter 1330, an output buffer circuit 1340 and an input buffer circuit 1350, for example.

In exemplary embodiments in accordance with principles of inventive concepts, input buffer circuit 1350 receives the gate-start pulse signal GSP and an input/output control signal DIO, and generates a first signal GSPi corresponding to the gate-start pulse signal GSP and a second signal DIOi corresponding to the input/output control signal DIO based on the gate-start pulse signal GSP and the input/output control signal DIO. The input/output control signal DIO may be included in the source control signal CONT1, for example. The shift register 1310 generates a pulse signal at every clock signal CLK based on a clock signal CLK and the input/output control signal DIO. The data latch circuit 1320 receives data DATA and a load signal TP and latches data DATA according to a shift order of the shift register 1310. The data latch circuit 1320 also outputs the data DATA under control of the load signal TP. The digital-to-analog converter 1330 generates input voltage signals VIN1 to VINn that are analog signals corresponding to output signals D1 to Dn of the data latch circuit 1320 using a gray voltage GMA.

In exemplary embodiments in accordance with principles of inventive concepts, output buffer circuit 1340 includes a plurality of channel amplifiers, compensates for an amplifier offset of each of the channel amplifiers in response to the first signal GSPi, and buffers the input voltage signals VIN1 to VINn to generate source signals Y1 to Yn. The source signals Y1 to Yn may be output to each source line according to an order of data DATA applied to the data latch circuit 1320, for example.

Figure 3:
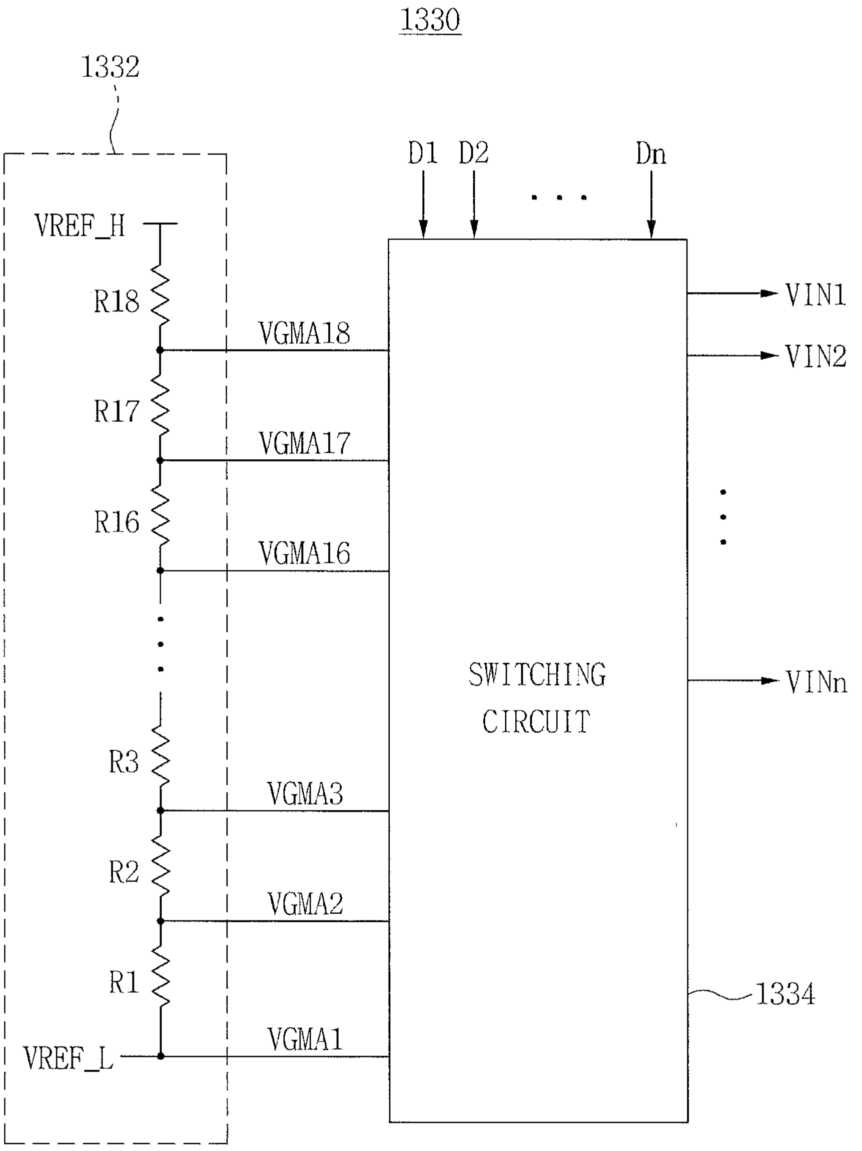
FIG. 3 is a circuit diagram illustrating an example of a digital-to-analog converter included in the source driving circuit of FIG. 2.

FIG. 3 is a circuit diagram illustrating an exemplary embodiment of a digital-to-analog converter 1330 such as may be included in the source driving circuit 1300 of FIG. 2. In exemplary embodiments in accordance with principles of inventive concepts, digital-to-analog converter 1330 may include a resistor string 1332 and a switching circuit 1334.

The resistor string 1332 may be coupled between a first reference voltage VREF_H and a second reference voltage VREF_L, may include resistors R1 to R18 serially connected to each other, and may output gamma voltages VGMA1 to VGMA18. For example, when a digital input signal D1, D2, . . . , and Dn is 4-bit data, the digital-to-analog converter 1330 may output 16 ($=2^4$) gamma voltages.

The switching circuit 1334 may output the gamma voltages VGMA1 to VGMA18 corresponding to the digital input signal D1, D2, . . . , and Dn as input voltage signals VIN1 to VINn supplied to output buffer circuit 1340.

Figure 4:
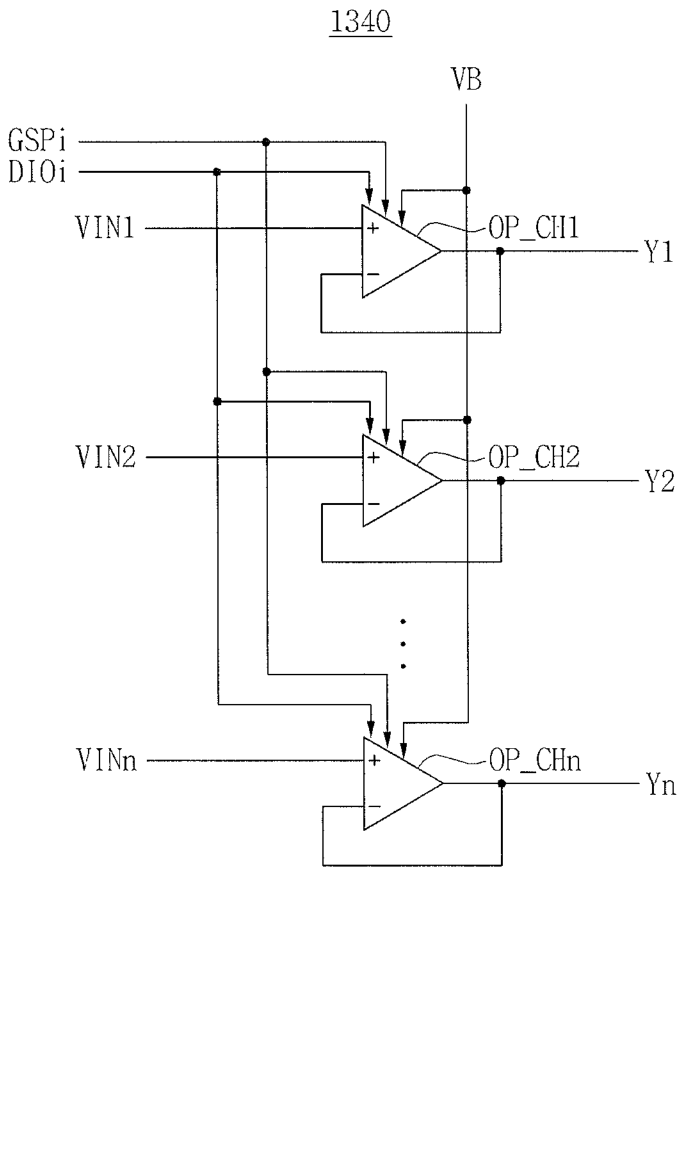
FIG. 4 is a circuit diagram illustrating an example of an output buffer circuit included in the source driving circuit of FIG. 2.

FIG. 4 is a circuit diagram illustrating an exemplary embodiment of an output buffer circuit 1340 such as may be included in the source driving circuit 1300 of FIG. 2. In exemplary embodiments in accordance with principles of inventive concepts, output buffer circuit 1340 may perform buffering on the input voltage signals VIN1 to VINn to generate output voltage signals Y1 to Yn. The output buffer circuit 1340 may include channel amplifiers OP_CH1 to OP_CHn which generate the output voltage signals Y1 to Yn. A bias voltage VB, the first signal GSPi and the second signal DIOi may be applied to the channel amplifiers OP_CH1 to OP_CHn. In exemplary embodiments in accordance with principles of inventive concepts the first signal GSPi may include information related to the gate-start pulse signal GSP and the second signal DIOi may include information related to the input/output control signal DIO.

Figure 5:
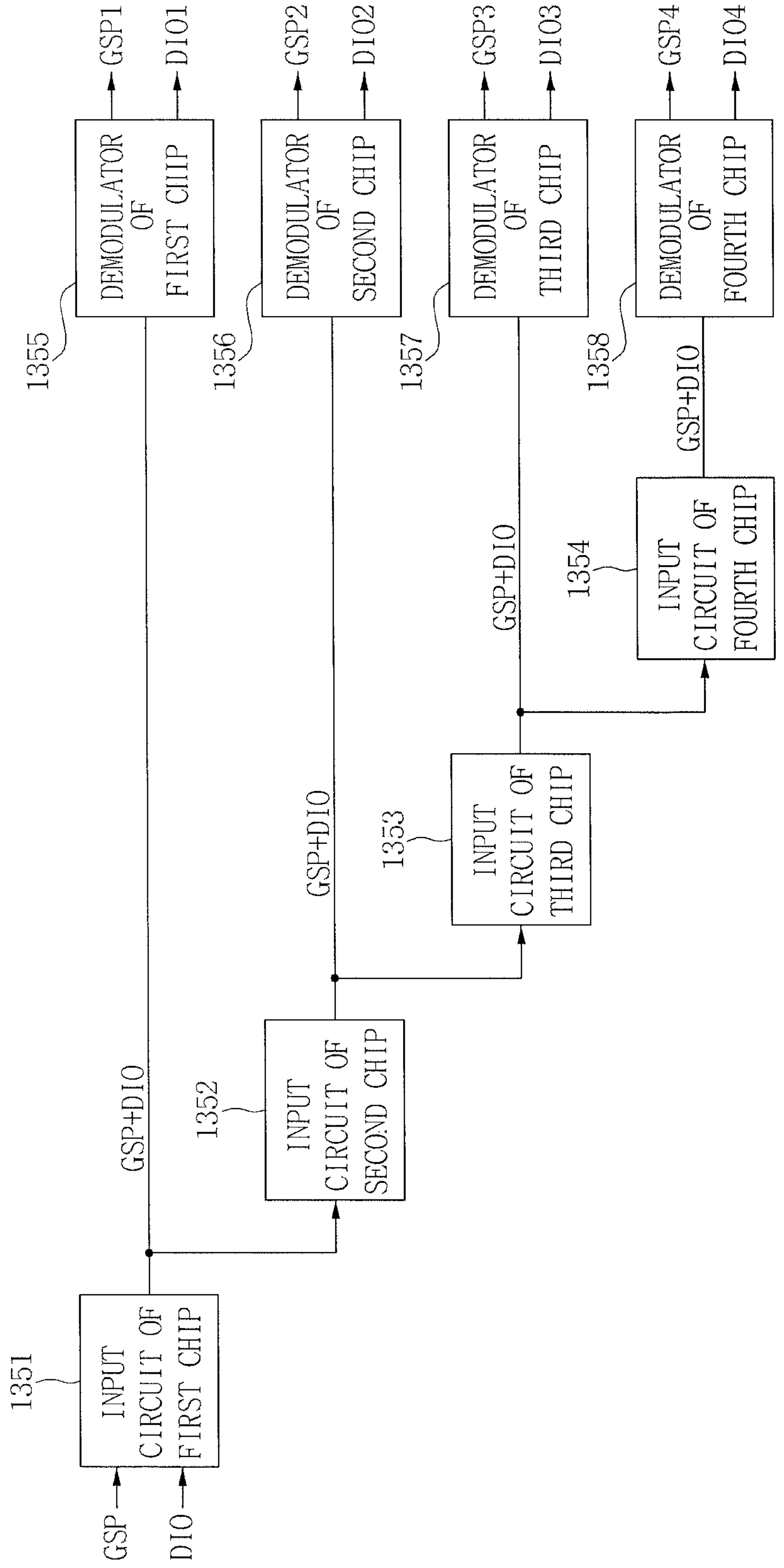
FIG. 5 is a circuit diagram illustrating an example of an input buffer circuit included in source driving chips of the source driving circuit of FIG. 2.

FIG. 5 is a circuit diagram illustrating an exemplary embodiment of a configuration of an input buffer circuit 1350 such as may be included in source driving chips of the source driving circuit 1300 of FIG. 2. In exemplary embodiments in accordance with principles of inventive concepts, input buffer circuit 1350 of the source driving circuit 1300 may include: an input circuit 1351 of a first source driving chip, a demodulator 1355 of the first source driving chip, an input circuit 1352 of a second source driving chip, a demodulator 1356 of the second source driving chip, an input circuit 1353 of a third source driving chip, a demodulator 1357 of the third source driving chip, an input circuit 1354 of a fourth source driving chip, and a demodulator 1358 of the fourth source driving chip.

In exemplary embodiments input circuit 1351 of the first source driving chip combines the gate-start pulse signal GSP and input/output control signal DIO included in the source control signal to generate a first signal GSP+DIO. The demodulator 1355 of the first source driving chip performs demodulation on the first signal GSP+DIO to generate a first internal gate-start pulse signal GSP1 and a first internal input/output control signal DIO1. The input circuit 1352 of the second source driving chip receives the first signal GSP+DIO from the input circuit of the first source driving chip, and outputs the first signal GSP+DIO. The demodulator 1356 of the second source driving chip receives the first signal GSP+DIO from the input circuit of the second source driving chip, and performs demodulation on the first signal GSP+DIO to generate a second internal gate-start pulse signal GSP2 and a second internal input/output control signal DIO2. The input circuit 1353 of the third source driving chip receives the first signal GSP+DIO from the input circuit of the second source driving chip, and outputs the first signal GSP+DIO. The demodulator 1357 of the third source driving chip receives the first signal GSP+DIO from the input circuit of the third source driving chip, and performs demodulation on the first signal GSP+DIO to generate a third internal gate-start pulse signal GSP3 and a third internal input/output control signal DIO3. The input circuit 1354 of the fourth source driving chip receives the first signal GSP+DIO from the input circuit of the third source driving chip, and outputs the first signal GSP+DIO. The demodulator 1358 of the fourth source driving chip receives the first signal GSP+DIO from the input circuit of the fourth source driving chip, and performs demodulation on the first signal GSP+DIO to generate a fourth internal gate-start pulse signal GSP4 and a fourth internal input/output control signal DIO4.

In the above, the input buffer circuit of a source driving circuit having four source driving chips has been described, but a source driving circuit in accordance with principles of inventive concepts is not limited thereto.

Figure 6:
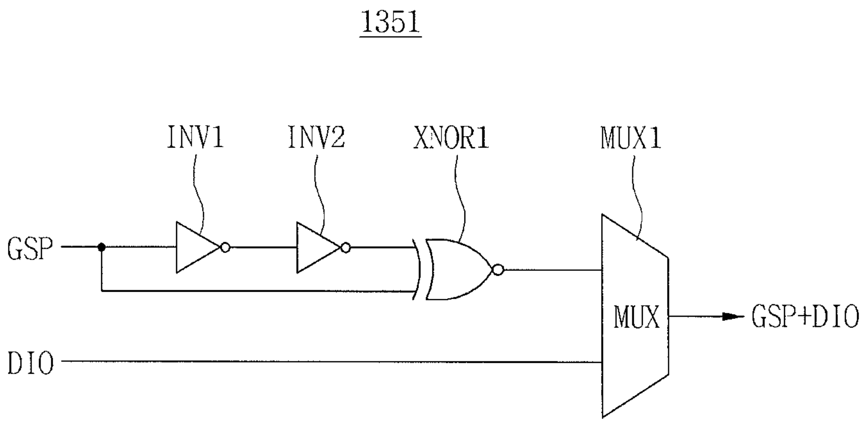
FIG. 6 is a circuit diagram illustrating an example of an input circuit of a first source driving chip included in the source driving circuit of FIG. 2.

FIG. 6 is a circuit diagram illustrating an exemplary embodiment of an input circuit 1351 of a first source driving chip in accordance with principles of inventive concepts such as may be included in the source driving circuit 1300 of FIG. 2. Input circuit 1351 of the first source driving chip may include: a delay circuit (inverters INV1 and INV2 in this exemplary embodiment) that delays the gate start pulse GSP for a fixed time, an XNOR gate XNOR1 that performs an exclusive NOR operation on the output signal of the delay circuit and the gate-start pulse signal GSP (to yield a positive pulse the width of the delay at each transition of the start pulse GSP). Multiplexer MUX selects either the output signal of the XNOR gate XNOR1 or the input/output control signal DIO to generate the first signal GSP+DIO.

Figure 7:
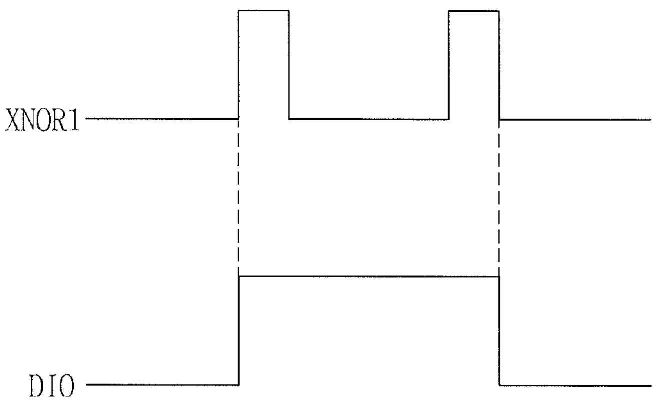
FIG. 7 is a diagram illustrating an example of a gate-start pulse signal (GSP) and an input/output control signal (DIO) applied to a circuit of FIG. 6.

FIG. 7 is a timing diagram illustrating an example of a signal XNOR1 derived from gate-start pulse signal GSP and an input/output control signal DIO applied to a circuit of FIG. 6. In this exemplary embodiment the pulse width of the input/output control signal DIO is larger than that of signal XNOR1, and two pulses of the signal XNOR1 are generated while one pulse of the input/output control signal DIO maintains a logic high state.

Figure 8:
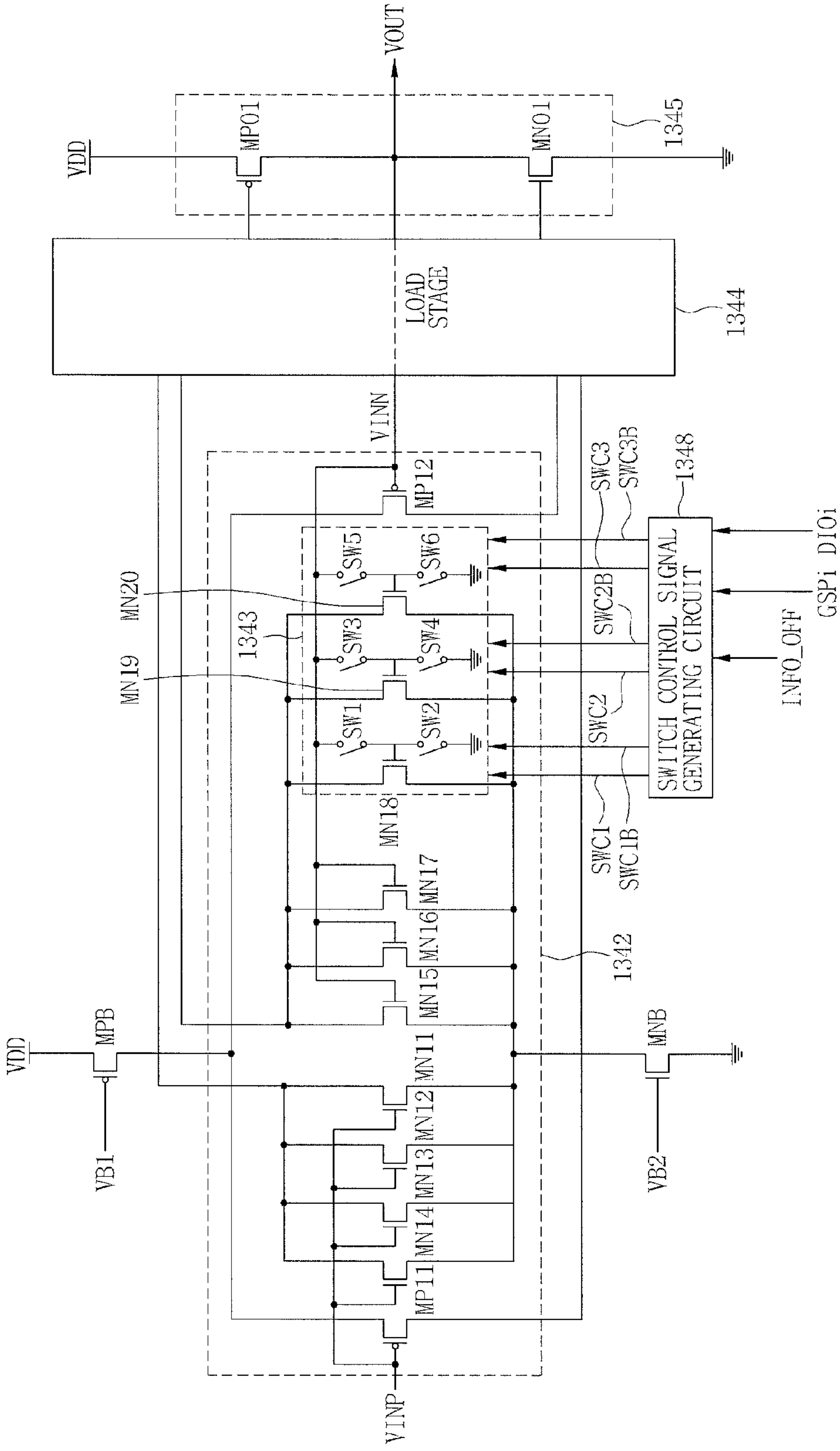
FIG. 8 is a circuit diagram illustrating an example of a configuration of a channel amplifier included in the output buffer circuit.

FIG. 8 is a circuit diagram illustrating an exemplary embodiment of a configuration of a channel amplifier 1341 in accordance with principles of inventive concepts such as may be included in the output buffer circuit 1340 of FIG. 4 (OP_CH1 through OP_CHn, for example). Channel amplifierl 341 may include: a differential input unit 1342, an upper bias unit including a PMOS transistor MPB, a lower bias unit including an NMOS transistor MNB, a load stage 1344, an output stage 1345 and a switch control signal generating circuit 1348. A bias voltage VB1 may be applied to the PMOS transistor MPB, and a bias voltage VB2 may be applied to the NMOS transistor MNB, for example.

In exemplary embodiments in accordance with principles of inventive concepts, differential input unit 1342 includes a P-type and an N-type differential input unit, and receives input voltage signal VINP and an input voltage signal VINN in a differential mode, and compensates for an amplifier offset in response to switch control signals SWC1, SWC1B, SWC2, SWC2B, SWC3 and SWC3B. With inverted differential input terminal connected to the output node, input voltage signal VINN is the same as output voltage signal VOUT.

In exemplary embodiments in accordance with principles of inventive concepts, P-type differential input unit may include PMOS transistors MP11 and MP12, and the N-type differential input unit may include NMOS transistors MN11 to MN17 and an amplifier offset compensating circuit 1343. The gate of NMOS transistor MN11 is connected to a non-inverted input terminal of the differential input unit 1342 and the gates of NMOS transistors MN12 to MN14 are connected in parallel to the gate of NMOS transistor MN11. The gate of NMOS transistor MN15 is connected to an inverted input terminal of the differential input unit 1342 and the gates of NMOS transistors MN16 and MN17 are connected in parallel to the gate of NMOS transistor MN15. The amplifier offset compensating circuit 1343 is connected in parallel at switches SW1, SW3, and SW5 to the gate of NMOS transistor MN15. As switches of amplifier compensations circuit 1343 (SW1 through SW6) are activated or deactivated under control of switch control signals (SWC1 through SWC3B) amplifier compensating circuit 1343 adjust the current flowing through the path from inverted input terminal VINN to compensate for amplifier offsets.

In exemplary embodiments in accordance with principles of inventive concepts, amplifier offset compensating circuit 1343 may include: NMOS transistors MN18, MN19 and MN20 with sources and drains respectively connected in parallel to the source and drain of NMOS transistor MN15. First switch SW1 is connected between the gate of NMOS transistor MN15 and the gate of NMOS transistors MN18. Second switch SW2 is connected between the gate of NMOS transistor MN18 and ground voltage. Third switch SW3 is connected between the gate of NMOS transistor MN15 and the gate of NMOS transistors MN19. Fourth switch SW4 is connected between the gate of NMOS transistor MN19 and ground voltage. Fifth switch SW5 is connected between the gate of NMOS transistor MN15 and the gate of NMOS transistor MN20. Sixth switch SW6 is connected between the gate of NMOS transistor MN20 and ground voltage.

In the exemplary circuit of FIG. 8 of the N-type differential input unit, a current path connected to the inverted input terminal may include the NMOS transistors MN15, MN16 and MN17 disposed between the load stage 1344 and the lower bias circuit, which includes NMOS transistor MNB. The NMOS transistors MN18, MN19 and MN20 of amplifier offset compensating circuit 1343 may also be placed in the current path through operation of switches SW1-SW6 in order to compensate for amplifier offsets.

The switch control signal generating circuit 1348 generates the switch control signals SWC1, SWC1B, SWC2, SWC2B, SWC3 and SWC3B based on offset information INFO_OFF. In exemplary embodiments in accordance with principles of inventive concepts, offset information INFO_OFF is a signal corresponding to the output voltage signal VOUT of the channel amplifier 1341 measured when the non-inverted input terminal and the inverted input terminal of the differential input unit of the channel amplifier 1341 are electrically connected.

In operation, switch control signals SWC1, SWC1B, SWC2, SWC2B, SWC3 and SWC3B are generated by the switch control signal generating circuit 1348. In exemplary embodiments in accordance with principles of inventive concepts, switch control generating circuit 1348 generates the switch control signals based on: the offset information INFO_OFF, the first signal GSPi, corresponding to the gate-start pulse signal, GSP and the second signal DIOi, corresponding to the input/output control signal DIO. As described above, in exemplary embodiments, the offset information INFO_OFF signal indicates the offset value of a channel amplifier 1341 being compensated. In exemplary embodiments in accordance with principles of inventive concepts the offset value may correspond to the output voltage signal VOUT of the channel amplifier 1341 when the non-inverted and inverted input terminals of the differential input unit of the channel amplifier 1341 are electrically connected. In exemplary embodiments, amplifier offset compensating circuit 1343 adjusts the current flowing through a current path connected to the inverted input terminal VINN to compensate for channel amplifier offsets. This may be accomplished, for example, by controlling operation of NMOS transistors MN18, MN19, and MN20 through operation of switches SW1 through SW6.

For example, by activating (also referred to herein as "turning on" or "closing") switch SW1 and deactivating (also referred to herein as "turning off" or "opening") switch SW2, NMOS transistor MN18 is turned on and current flow through load circuit is increased. Conversely, by deactivating switch SW1 and activating switch SW2, NMOS transistor MN18 is turned off and current flow through load circuit is decreased. Switches SW3-SW6 may be similarly operated to increase or decrease current flow, with each additional compensation transistor MN18-MN20 turned on or off respectively increasing or decreasing offset-compensation current for the associated channel amplifier.

In exemplary embodiments in accordance with principles of inventive concepts, the non-inverted VINP and inverted VINN differential inputs are electrically connected and, if the output VOUT of the channel amplifier transitions from a "low" state to a "high" state that indicates that the amplifier has an offset. The offset may be due, for example, to an imbalanced current flow, with, for example, a greater current flow through the circuit associated with the non-inverting input than through the circuit associated with the inverting input. In accordance with principles of inventive concepts, that imbalance in current flow may be offset by increasing current flow in the circuit associated with the inverting input. Such compensating current may be generated, for example, by activating one or more of the compensation transistors MN18-MN20 under control of switch control signal generating circuit 1348, for example. In accordance with principles of inventive concepts, one compensation transistor (for example, MN18) may be activated and, if the amplifier offset persists, additional compensation transistors (for example, MN 19 and MN 20) may be activated until the amplifier offset has been reduced to an acceptable level, as indicated by the output VOUT not transitioning when the non-inverting VINP and inverting VINN inputs are electrically connected. In exemplary embodiments in accordance with principles of inventive concepts, offset compensation is performed on an amplifier during a time when analog voltages are not required to drive source lines, for example, when a row of thin film transistors is not selected for driving by a gate pulse.

Figure 9:
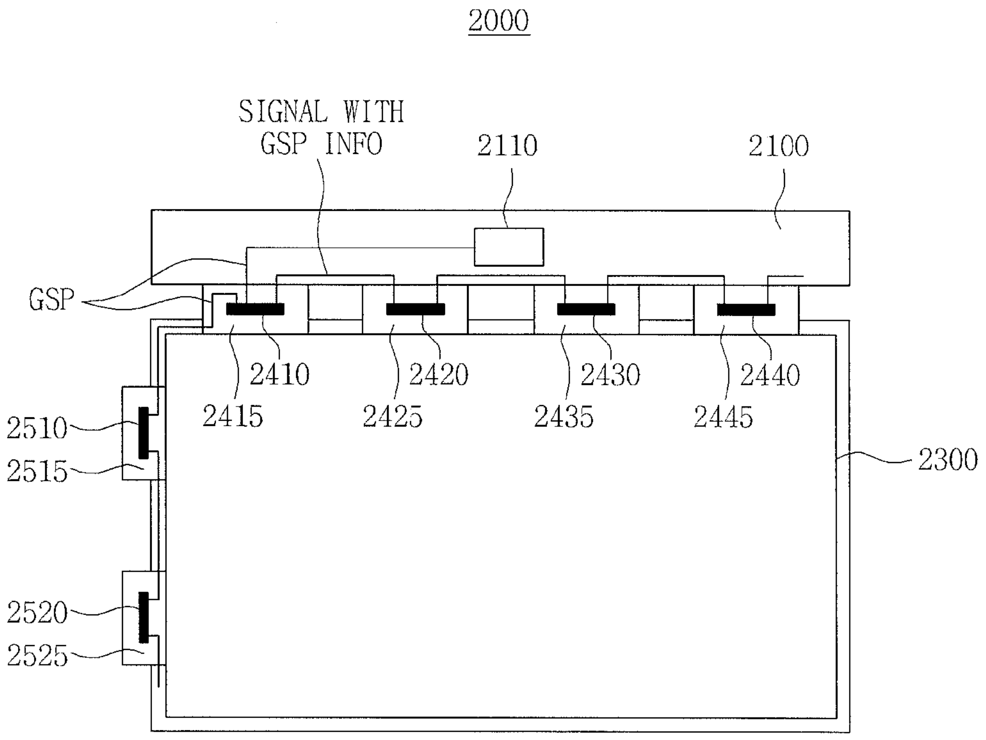
FIG. 9 is a circuit diagram illustrating an exemplary embodiment of a display device in accordance with principles of inventive concepts.

FIG. 9 is a circuit diagram illustrating an exemplary embodiment of a display device 2000, in accordance with principles of inventive concepts. Display device 2000 may include a control circuit 2110 mounted on a substrate 2100, a display panel 2300, flexible printed circuit (FPC) boards 2415, 2425, 2435 and 2445, source driving chips 2410, 2420, 2430 and 2440 mounted on the FPC boards 2415, 2425, 2435 and 2445, FPCs 2515 and 2525, gate driving chips 2510 and 2520 mounted on the FPC boards 2515 and 2525.

The gate-start pulse signal (GSP) may be provided to the gate driving chips 2510 and 2520 of a gate driving circuit so as to pass through the first source driving chip 2410 of the plurality of source driving chips 2410, 2420, 2430 and 2440 through a conductive line disposed in a flexible printed circuit (FPC) board 2415 on which the first source driving chip 2410 is mounted. The first source driving chip 2410 may directly receive the gate-start pulse signal GSP from the control circuit 2110, and the remaining source driving chips 2420, 2430 and 2440 may receive a signal generated by the first source driving chip 2410 and having information of the gate-start pulse signal GSP.

Figure 10:
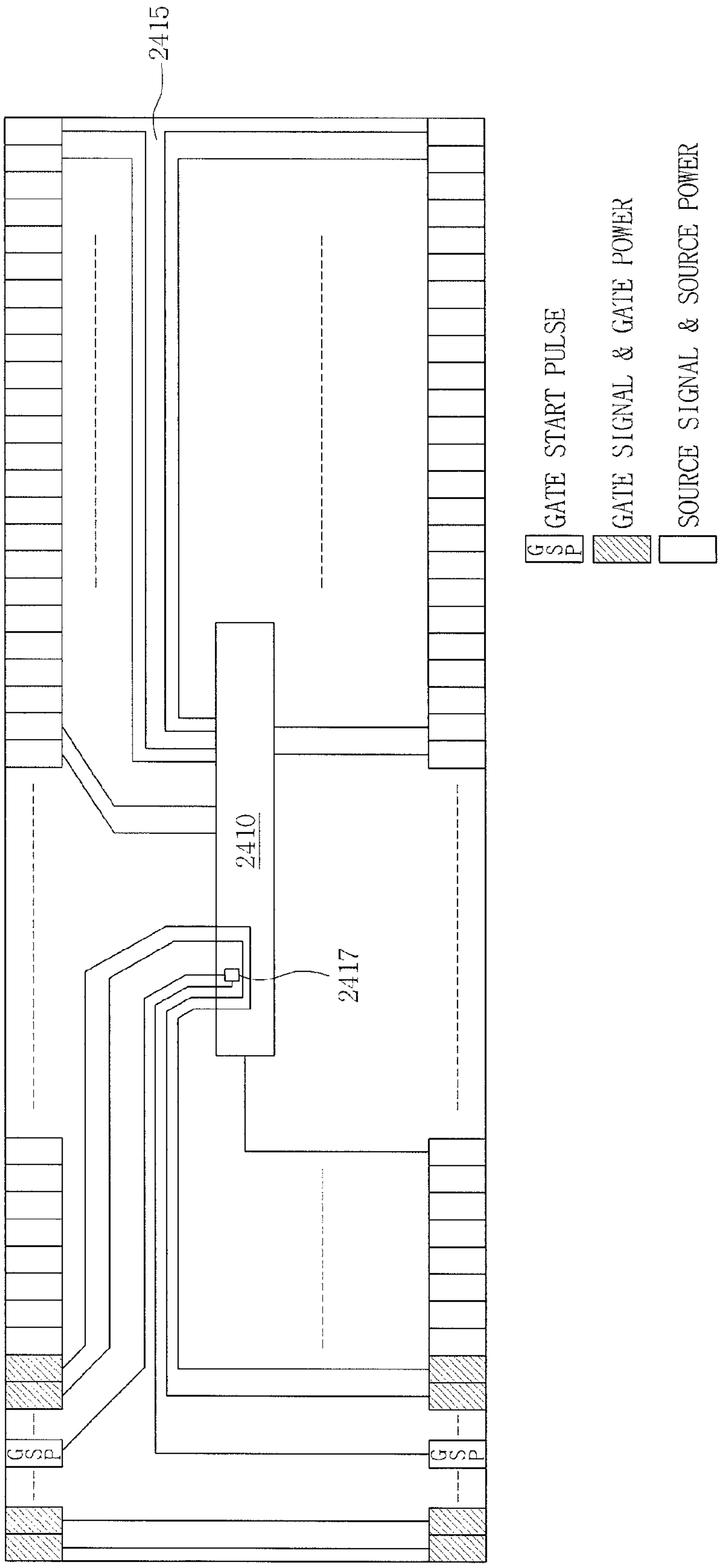
FIG. 10 is a diagram illustrating an example of a structure of COF included in the display device of FIG. 9.

FIG. 10 is a diagram illustrating an exemplary embodiment of the structure of a chip-on-flexible circuit (COF) in accordance with principles of inventive concepts included in the display device of FIG. 9. Referring to FIG. 10, the COF may include a first source driving chip 2410 mounted on the flexible printed circuit (FPC) board 2415. The gate-start pulse signal GSP may be provided to a pad 2417 of the first source driving chip 2410 of the plurality of source driving chips 2410, 2420, 2430 and 2440 through a conductive line disposed in the flexible printed circuit (FPC) board on which the first source driving chip 2410 is mounted. As described above, the gate-start pulse signal GSP may be provided to the gate driving chips 2510 and 2520 of a gate driving circuit so as to the first source driving chip 2410 through a conductive line disposed in a flexible printed circuit (FPC) board 2415 on which the first source driving chip 2410 of the plurality of source driving chips 2410, 2420, 2430 and 2440 is mounted.

Inventive concepts may be applied generally to display devices such as a plasma display panel (PDP), an organic light emitting diode (OLED) in addition to the LCD device.

Embodiments of inventive concepts may be applied to a source driving circuit, and a display device including the source driving circuit.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of inventive concepts as defined in the claims. In the claims, means-plus-function clauses are intended to cover the structures described herein as performing the recited function, and not only structural equivalents but also equivalent structures.

What is claimed is:

1. A display device, comprising:

a display panel including a plurality of gate lines and a plurality of source lines disposed perpendicularly to the plurality of gate lines;

a control circuit configured to generate a source control signal, to generate a gate control signal and a gate-start pulse signal, to process data according to operating conditions of the display panel, and to output the processed data;

a gate driving circuit including a plurality of gate driving chips, configured to generate gate signals including a combination of on-voltage and off-voltage in response to the gate-start pulse signal and the gate control signal, and to apply the gate signals to the gate lines; and a source driving circuit including a plurality of source driving chips configured to compensate for an amplifier offset in response to the gate-start pulse signal, to perform digital-to-analog conversion on data received from the control circuit using gray scale voltages in response to the source control signal, and to provide the converted data to the source lines, wherein the source driving circuit is configured to compensate offsets by adjusting current flow through a current path connected to an amplifier load stage, wherein the source driving circuit comprises:

an input circuit of a first source driving chip configured to combine the gate-start pulse signal and an input/output control signal included in the source control signal to generate a first signal;

a demodulator of the first source driving chip configured to perform demodulation on the first signal to generate a first internal gate-start pulse signal and a first internal input/output control signal;

an input circuit of a second source driving chip configured to receive the first signal from the input circuit of the first source driving chip, and output the first signal; and a demodulator of the second source driving chip configured to receive the first signal from the input circuit of the second source driving chip, and perform demodulation on the first signal to generate a second internal gate-start pulse signal and a second internal input/output control signal.

2. The display device of claim 1, wherein, of the plurality of source driving chips in the source driving circuit, the first source driving chip directly receives the gate-start pulse signal from the control circuit, and the remaining source driving chips receive a signal generated by the first source driving chip derived from the gate-start pulse signal.

3. The display device of claim 1, wherein the plurality of source driving chips is configured to be mounted on respective corresponding flexible printed circuit boards.

4. The display device of claim 3, wherein the gate-start pulse signal is provided to the first source driving chip through a conductive line disposed in a flexible printed circuit board on which the first source driving chip of the plurality of source driving chips is mounted.

5. The display device of claim 3, wherein the gate-start pulse signal is provided to the gate driving circuit so as to pass through the first source driving chip through a conductive line disposed in a flexible printed circuit board on which a first source driving chip is mounted of the plurality of source driving chips.

6. The display device of claim 1, wherein the first signal is configured to include information related to the gate-start pulse signal.

7. The display device of claim 1, wherein the input circuit of the first source driving chip comprises:

a delay circuit configured to delay the gate start pulse signal for a certain time;

an XNOR gate configured to perform exclusive NOR operation on an output signal of the delay circuit and the gate-start pulse signal; and a multiplexer configured to select either an output signal of the XNOR gate or the input/output control signal to generate the first signal.

8. The display device of claim 7, wherein the delay circuit includes an even number of inverters connected in series.

9. The display device of claim 1, wherein the source driving circuit further comprises:

an input circuit of a third source driving chip configured to receive the first signal from the input circuit of the second source driving chip, and output the first signal;

a demodulator of the third source driving chip configured to receive the first signal from the input circuit of the third source driving chip, and perform demodulation on the first signal to generate a third internal gate-start pulse signal and a third internal input/output control signal;

an input circuit of a fourth source driving chip configured to receive the first signal from the input circuit of the third source driving chip, and output the first signal; and a demodulator of the fourth source driving chip configured to receive the first signal from the input circuit of the fourth source driving chip, and perform demodulation on the first signal to generate a fourth internal gate-start pulse signal and a fourth internal input/output control signal.

10. The display device of claim 1, wherein the source driving circuit comprises:

a first source driving chip configured to receive the gate-start pulse signal from the control circuit, and generate a first signal having information of the gate-start pulse signal and a first internal gate-start pulse signal based on the gate-start pulse signal; and a second source driving chip configured to receive the first signal having information of the gate-start pulse signal from the first source driving chip, and generate a second internal gate-start pulse signal based on the first signal.

11. The display device of claim 1, wherein the source driving circuit comprises:

an input buffer circuit configured to receive the gate-start pulse signal and an input/output control signal, and generate a first signal corresponding to the gate-start pulse signal and a second signal corresponding to the input/output control signal based on the gate-start pulse signal and the input/output control signal;

a shift register configured to generate a pulse signal based on a clock signal and the input/output control signal;

a data latch circuit configured to latch data according to a shift order of the shift register, and output the data as digital input signals in response to a load signal;

a digital-to-analog converter configured to generate input voltage signals corresponding to the digital input signals using gray voltages; and an output buffer circuit including a plurality of channel amplifiers, and configured to compensate for an amplifier offset of each of the channel amplifiers in response to the first signal, and buffer the input voltage signals to generate source signals.

12. The display device of claim 11, wherein the input buffer circuit comprises:

an input circuit configured to combine the gate-start pulse signal and the input/output control signal included in the source control signal to generate a first signal; and a demodulator configured to perform demodulation on the first signal to generate an internal gate-start pulse signal and an internal input/output control signal.

13. The display device of claim 11, wherein the output buffer circuit is configured to react to an output voltage signal of each of the channel amplifiers in a state in which a non-inverted input terminal and an inverted input terminal of a differential input unit of each of the channel amplifiers are electrically connected, by compensating for amplifier offset.

* * * * *